(12) United States Patent
Duan et al.

(10) Patent No.: US 10,196,751 B2
(45) Date of Patent: Feb. 5, 2019

(54) NITROGEN CONTAINING POLYMERS AS LEVELERS

(71) Applicants: ROHM AND HAAS ELECTRONIC MATERIALS LLC, Marlborough, MA (US); DOW GLOBAL TECHNOLOGIES LLC, Midland, MI (US)

(72) Inventors: Lingli Duan, Shanghai (CN); Zuhra I. Niazimbetova, Westborough, MA (US); Chen Chen, Shanghai (CN); Tong Sun, Shanghai (CN); Maria Rzeznik, Shrewsbury, MA (US)

(73) Assignees: Rohm and Haas Electronic Materials LLC, Marlborough, MA (US); Dow Global Technologies LLC, Midland, MI (US)

( * ) Notice: Subject to any disclaimer, the term of this patent is extended or adjusted under 35 U.S.C. 154(b) by 236 days.

(21) Appl. No.: 15/021,075

(22) PCT Filed: Nov. 6, 2013

(86) PCT No.: PCT/CN2013/086585
§ 371 (c)(1),
(2) Date: Mar. 10, 2016

(87) PCT Pub. No.: WO2015/066848
PCT Pub. Date: May 14, 2015

(65) Prior Publication Data
US 2016/0237579 A1    Aug. 18, 2016

(51) Int. Cl.
| | |
|---|---|
| *C25D 3/38* | (2006.01) |
| *C25D 3/32* | (2006.01) |
| *C09D 179/04* | (2006.01) |
| *C08G 73/06* | (2006.01) |
| *C25D 3/58* | (2006.01) |
| *C25D 3/60* | (2006.01) |
| *H05K 3/10* | (2006.01) |
| *C25D 7/00* | (2006.01) |
| *H05K 3/18* | (2006.01) |
| *C25D 7/12* | (2006.01) |

(52) U.S. Cl.
CPC ........... *C25D 3/32* (2013.01); *C08G 73/0616* (2013.01); *C09D 179/04* (2013.01); *C25D 3/38* (2013.01); *C25D 3/58* (2013.01); *C25D 3/60* (2013.01); *C25D 7/00* (2013.01); *H05K 3/10* (2013.01); *C25D 7/123* (2013.01); *H05K 3/188* (2013.01); *H05K 2203/0723* (2013.01)

(58) Field of Classification Search
None
See application file for complete search history.

(56) References Cited

U.S. PATENT DOCUMENTS

| | | | |
|---|---|---|---|
| 3,502,551 | A | 3/1970 | Todt et al. |
| 6,425,996 | B1 | 7/2002 | Dahms et al. |
| 6,610,192 | B1 | 8/2003 | Step et al. |
| 6,800,188 | B2 | 10/2004 | Hagiwara et al. |
| 7,128,822 | B2 | 10/2006 | Wang et al. |
| 7,374,652 | B2 | 5/2008 | Hayashi et al. |
| 2004/0249177 | A1 | 12/2004 | Wang et al. |
| 2006/0016693 | A1 | 1/2006 | Wang et al. |
| 2006/0118422 | A1 | 6/2006 | Ko et al. |
| 2010/0155257 | A1 | 6/2010 | Brunner et al. |
| 2011/0220513 | A1 | 9/2011 | Niazimbetova et al. |
| 2011/0220514 | A1 | 9/2011 | Niazimbetova |
| 2012/0292193 | A1 | 11/2012 | Roeger-Goepfert et al. |

FOREIGN PATENT DOCUMENTS

| | | |
|---|---|---|
| CA | 2080422 | 4/1993 |
| CN | 1814649 | 8/2006 |
| EP | 0540895 A1 | 5/1993 |
| EP | 1619274 | 11/2011 |
| EP | 2392692 | 12/2011 |
| EP | 2530102 A1 | 12/2012 |
| EP | 1978134 | 9/2013 |
| WO | 2011151785 | 12/2011 |

OTHER PUBLICATIONS

Search report for corresponding China Application No. 201380080350.7 dated Sep. 29, 2017.
Search report for corresponding Europe Application No. 13 89 6914 dated Jun. 29, 2017.
Search report for corresponding China Application No. 201380080350.7 dated Feb. 27, 2017.

*Primary Examiner* — Stefanie S Wittenberg
(74) *Attorney, Agent, or Firm* — John J. Piskorski

(57) ABSTRACT

Polymers of reaction products of polyamines and nitrogen containing cyclic compounds are included in metal electroplating compositions to provide level metal deposits on substrates.

3 Claims, No Drawings

NITROGEN CONTAINING POLYMERS AS LEVELERS

FIELD OF THE INVENTION

The present invention is directed to nitrogen containing polymers as levelers for electroplating compositions. More specifically, the present invention is directed to nitrogen containing polymers as levelers for electroplating compositions which are reaction products of polyamines and nitrogen containing cyclic compounds with good thermal reliability and throwing power.

BACKGROUND OF THE INVENTION

Methods for electroplating articles with metal coatings generally involve passing a current between two electrodes in a plating solution where one of the electrodes is the article to be plated. A typical acid copper plating solution comprises dissolved copper, usually copper sulfate, an acid electrolyte such as sulfuric acid in an amount sufficient to impart conductivity to the bath, and proprietary additives to improve the uniformity of the plating and the quality of the metal deposit. Such additives include accelerators, levelers, and suppressors, among others.

Electrolytic copper plating solutions are used in a variety of industrial applications, such as decorative and anticorrosion coatings, as well as in the electronics industry, particularly for the fabrication of printed circuit boards and semiconductors. For circuit board fabrication, copper is electroplated over selected portions of the surface of a printed circuit board, into blind vias and onto the walls of through-holes passing between the surfaces of the circuit board base material. The walls of a through-hole are first made conductive, such as by electroless metal deposition, before copper is electroplated onto the walls of the through-hole. Plated through-holes provide a conductive pathway from one board surface to the other. For semiconductor fabrication, copper is electroplated over a surface of a wafer containing a variety of features such as vias, trenches or combinations thereof. The vias and trenches are metallized to provide conductivity between various layers of the semiconductor device.

It is well known in certain areas of plating, such as in electroplating of printed circuit boards ("PCBs"), that the use of accelerators and/or levelers in the electroplating bath can be crucial in achieving a uniform metal deposit on a substrate surface. Plating a substrate having irregular topography can pose particular difficulties. During electroplating a voltage drop variation typically exists along an irregular surface which can result in an uneven metal deposit. Plating irregularities are exacerbated where the voltage drop variation is relatively extreme, that is, where the surface irregularity is substantial. As a result, a thicker metal deposit, termed overplating, is observed over such surface irregularities. Consequently, a metal layer of substantially uniform thickness is frequently a challenging step in the manufacture of electronic devices. Leveling agents are often used in copper plating baths to provide substantially uniform, or level, copper layers in electronic devices.

The trend of portability combined with increased functionality of electronic devices has driven the miniaturization of PCBs. Conventional multilayer PCBs with through-hole interconnect vias are not always a practical solution. Alternative approaches for high density interconnects have been developed, such as sequential build up technologies, which utilize blind vias. One of the objectives in processes that use blind vias is the maximizing of via filling while minimizing thickness variation in the copper deposit across the substrate surface. This is particularly challenging when the PCB contains both through-holes and blind vias.

Generally, leveling agents used in copper plating baths provide better leveling of the deposit across the substrate surface but tend to compromise the throwing power of the electroplating bath. Throwing power is defined as the ratio of the hole center copper deposit thickness to its thickness at the surface. Newer PCBs are being manufactured that contain both through-holes and blind vias. Current bath additives, in particular current leveling agents, do not provide level copper deposits on the substrate surface and fill through-holes and/or fill blind vias effectively. Accordingly, there remains a need in the art for leveling agents for use in copper electroplating baths used in the manufacture of PCBs that provide level copper deposits while not significantly affecting the throwing power of the bath.

SUMMARY OF THE INVENTION

Polymers include a reaction product of one or more polyamines with one or more nitrogen containing compounds having formula:

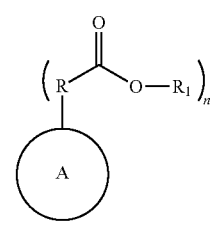

(I)

where A is a substituted or unsubstituted 5-6 membered aromatic heterocyclic ring, a substituted or unsubstituted 5-6 membered aromatic carbocyclic ring or a substituted or unsubstituted fused heterocyclic ring system of a five membered heterocyclic ring to a six membered carbocyclic or heterocyclic ring, R is a covalent bond, linear or branched $(C_1\text{-}C_{12})$alkyl, —NH—, —$R_2$NH— or —$R_2NHR_3$— joining the carbon atom or heteroatom of ring A or an atom of a substituent group on ring A to —C(O)—O—$R_1$, n is an integer of 2 or greater, $R_2$ and $R_3$ are the same or different and are linear or branched $(C_1\text{-}C_{12})$alkyl, and with the proviso that there is at least one nitrogen atom in ring A, in a substituent of ring A or in R, and $R_1$ is hydrogen or linear or branched $(C_1\text{-}C_{12})$alkyl, optionally, formula (I) may be positively charged.

Metal electroplating compositions include: one or more sources of metal ions, an electrolyte, and one or more polymers, the one or more polymers include a reaction product of one or more polyamines and one or more nitrogen containing compounds having formula:

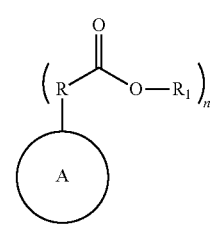

(I)

where A is a substituted or unsubstituted 5-6 membered aromatic heterocyclic ring, a substituted or unsubstituted 5-6 membered aromatic carbocyclic ring or a substituted or unsubstituted fused heterocyclic ring system of a five membered heterocyclic ring to a six membered carbocyclic or heterocyclic ring, R is a covalent bond, linear or branched ($C_1$-$C_{12}$)alkyl, —NH—, —$R_2$NH— or —$R_2$NHR$_3$— joining the carbon atom or heteroatom of ring A to the —C(O)—O—$R_1$, n is an integer of 2 and greater, $R_2$ and $R_3$ are the same or different and are linear or branched ($C_1$-$C_{12}$)alkyl, and with the proviso that there is at least one nitrogen atom in ring A, in a substituent on ring A or in R, and $R_1$ is hydrogen or linear or branched ($C_1$-$C_{12}$)alkyl, optionally, formula (I) may be positively charged.

Methods include contacting a substrate to be metal plated with a metal electroplating composition including: a source of metal ions, an electrolyte, and one or more polymers, the one or more polymers include a reaction product of one or more polyamines and one or more nitrogen containing compounds having formula:

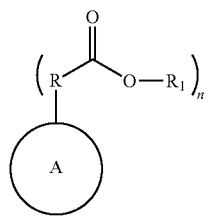

(I)

where A is a substituted or unsubstituted 5-6 membered aromatic heterocyclic ring, a substituted or unsubstituted 5-6 membered aromatic carbocyclic ring or a substituted or unsubstituted fused heterocyclic ring system of a five membered heterocyclic ring to a six membered carbocyclic or heterocyclic ring, R is a covalent bond, linear or branched ($C_1$-$C_{12}$)alkyl, —NH—, —$R_2$NH— or —$R_2$NHR$_3$— joining the carbon atom or heteroatom of ring A or an atom of a substituent on ring A to —C(O)—O—$R_1$, n is an integer of 2 or greater, $R_2$ and $R_3$ are the same or different and are linear or branched ($C_1$-$C_{12}$)alkyl, and with the proviso that there is at least one nitrogen atom in ring A, in a substituent of ring A or in R, and $R_1$ is hydrogen or linear or branched ($C_1$-$C_{12}$)alkyl, optionally, formula (I) may be positively charged; applying a current; and depositing the metal on the substrate.

The polymers provide metal layers having a substantially level surface across a substrate, even on substrates having small features and on substrates having a variety of feature sizes. The metal layers deposited according to the methods have improved thermal stability as compared to metal deposits from electroplating baths using conventional leveling agents. Further, the methods effectively deposit metals in through-holes and blind via holes such that the metal plating compositions have good throwing power.

DETAILED DESCRIPTION OF THE INVENTION

As used throughout this specification the following abbreviations shall have the following meanings unless the context clearly indicates otherwise: A=amperes; A/dm$^2$=amperes per square decimeter; ° C.=degrees Centigrade; g=gram; mg=milligram; ppm=parts per million; mmol=millimoles; L=liter, L/m=liters per minute; μm=micron=micrometer; mm=millimeters; cm=centimeters; DI=deionized; mL=milliliter; Mw=weight average molecular weight; and Mn=number average molecular weight; and v/v=volume to volume. All amounts are percent by weight unless otherwise noted. All numerical ranges are inclusive and combinable in any order, except where it is clear that such numerical ranges are constrained to add up to 100%.

As used throughout the specification, "feature" refers to the geometries on a substrate. "Apertures" refer to recessed features including through-holes and blind vias. As used throughout this specification, the term "plating" refers to metal electroplating. "Deposition" and "plating" are used interchangeably throughout this specification. "Halide" refers to fluoride, chloride, bromide and iodide. "Accelerator" refers to an organic additive that increases the plating rate of the electroplating bath. A "suppressor" refers to an organic additive that suppresses the plating rate of a metal during electroplating. "Leveler" refers to an organic compound that is capable of providing a substantially level or planar metal layer. The terms "leveler" and "leveling agent" are used interchangeably throughout this specification. The terms "printed circuit boards" and "printed wiring boards" are used interchangeably throughout this specification. The articles "a" and "an" refer to the singular and the plural.

The polymers are reaction products of one or more polyamines and one or more nitrogen containing compounds having formula:

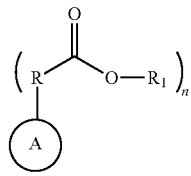

(I)

where A is a substituted or unsubstituted 5-6 membered aromatic heterocyclic ring, a substituted or unsubstituted 5-6 membered aromatic carbocyclic ring or a substituted or unsubstituted fused heterocyclic ring system of a five membered heterocyclic ring to a six membered carbocyclic or heterocyclic ring, R is a covalent bond, linear or branched ($C_1$-$C_{12}$)alkyl, —NH—, —$R_2$NH— or —$R_2$NHR$_3$—, preferably R is a linear or branched ($C_1$-$C_{12}$)alkyl, joining —C(O)—O—$R_1$ to a carbon atom or hetero atom of ring A or to an atom of a substituent group joined to ring A, more preferably R is a linear or branched ($C_1$-$C_{12}$)alkyl joining —C(O)—O—$R_1$ to a nitrogen atom of ring A, n is an integer of 2 or greater, preferably 2 to 4, more preferably n is 2, $R_2$ and $R_3$ are the same or different and are linear or branched ($C_1$-$C_{12}$)alkyl, and with the proviso that there is at least one nitrogen atom in either ring A, in a substituent on ring A, or in R, and $R_1$ is hydrogen or linear or branched ($C_1$-$C_{12}$)alkyl. Hetero atoms in the heterocyclic aromatic rings include one or more of nitrogen, sulfur and oxygen. Preferably, the hetero atom is nitrogen. Substituent groups include, but are not limited to linear or branched alkyl; hydroxyl; amino; amide; linear or branched hydroxyalkyl; halide, linear or branched haloalkyl; thio; linear or branched thioalkyl; linear or branched alkoxy; primary, secondary or tertiary amine; carboxyl, linear or branched carboxyalkyl; aldehyde; ketone; and substituted or unsubstituted aryl. Substituent groups on the aryl may include the recited foregoing groups. Formula (I) may be positively charged.

Compounds of five and six membered aromatic carbocyclic rings include, but are not limit to the following:

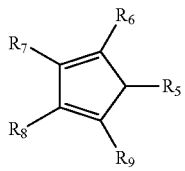
(II)

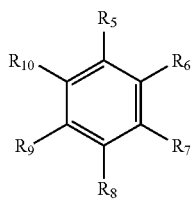
(III)

where $R_5$, $R_6$, $R_7$, $R_8$, $R_9$ and $R_{10}$ may be the same or different and may be hydrogen, hydroxyl, amino; amide; linear or branched hydroxy($C_1$-$C_{10}$)alkyl, linear or branched ($C_1$-$C_{10}$)alkoxy, halide, linear or branched ($C_1$-$C_{10}$)alkyl halide, —$NH_2$, primary, secondary or tertiary linear or branched ($C_1$-$C_{12}$)alkyl amine, aldehyde, ketone, carboxyl, linear or branched carboxy($C_1$-$C_{10}$)alkyl, linear or branched ($C_1$-$C_{20}$)alkyl; a substituted or unsubstituted aryl; or substituted or unsubstituted alkylaryl. The atoms of an adjacent pair of $R_5$-$R_{10}$, such as the carbon atoms of $R_8$ and $R_9$ of formula (II) or formula (III) may be taken together to form an unsaturated five or six membered substituted or unsubstituted ring. Preferably, at least one of $R_5$ to $R_{10}$ is —$NH_2$ or a primary or secondary amine. When A is a carbocyclic ring, preferably, the carbocyclic ring is a six membered ring. Exemplary compounds have the following general formula:

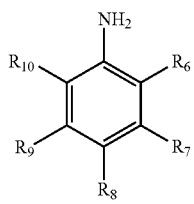
(IV)

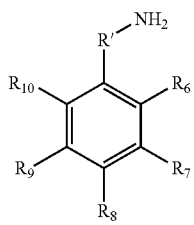
(V)

where $R_6$ to $R_{10}$ are as defined above and R' is a linear or branched ($C_1$-$C_{12}$)alkyl.

Compounds of five and six membered aromatic heterocyclic rings include, but are not limit to the following:

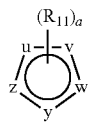
(VI)

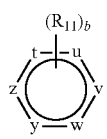
(VII)

where variables t, u, v, w, y and z are independently carbon, nitrogen, oxygen or sulfur with the proviso that at least one of the variables is carbon and at least one is nitrogen, preferably, the hetero atoms are all nitrogen; a is an integer of 1 to 5, preferably from 1 to 4, b is an integer of 1 to 6, preferably from 1 to 5, and $R_{11}$ may be the same or different and include, but is not limited to hydrogen, hydroxyl, amino; amide; linear or branched hydroxy($C_1$-$C_{10}$)alkyl, linear or branched ($C_1$-$C_{10}$)alkoxy, halide, linear or branched ($C_1$-$C_{10}$)alkyl halide, —$NH_2$, primary, secondary or tertiary linear or branched ($C_1$-$C_{12}$)alkyl amine, aldehyde, ketone, carboxyl, linear or branched carboxy($C_1$-$C_{10}$)alkyl, linear or branched ($C_1$-$C_{20}$)alkyl, thio, thioalkyl, a substituted or unsubstituted aryl; or a substituted or unsubstituted alkylaryl. An adjacent pair of atoms of $R_{11}$ groups of structures (VI) or (VII) may be taken together to form an unsaturated six membered substituted or unsubstituted ring fused to ring structures (VI) or an unsaturated five membered substituted or unsubstituted ring fused to rings structure (VII) having formula (VIII).

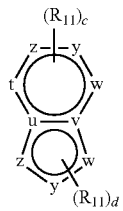
(VIII)

where t, u, v, w, y and z and $R_{11}$ are defined as above and c is an integer of 1 to 4 and d is an integer of 1 to 3. Preferably, $R_{11}$ is one or more of hydrogen, hydroxyl, —$NH_2$, primary or secondary amine and linear or branched ($C_1$-$C_{10}$)alkyl, more preferably, $R_{11}$ is one or more of hydrogen, hydroxyl and linear or branched ($C_1$-$C_{10}$)alkyl. Representatives of such compounds are imidazoles, triazoles, tetrazoles, thiazoles, benzimidazoles, oxazoles, aminopyridines, alkylaminopyridines and derivatives thereof. Preferably the nitrogen compounds are five membered heterocyclic rings as formula (VI) above where the hetero atoms of the five membered heterocyclic ring are nitrogen. Exemplary compounds include the following:

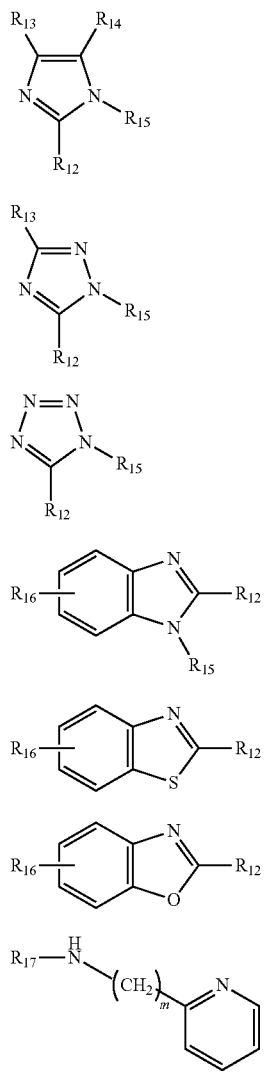

(IXa)

(IXb)

(IXc)

(IXd)

(IXe)

(IXf)

(IXg)

where $R_{12}$, $R_{13}$, $R_{14}$, $R_{15}$, $R_{16}$ and $R_{17}$ are the same or different and include, but are not limited to hydrogen, linear or branched ($C_1$-$C_{12}$)alkyl, substituted or unsubstituted aryl, hydroxylalkyl, hydroxyl, thio, thioalkyl, —$NH_2$, primary amine or secondary amine, where m is an integer of 0 to ten with the proviso that when m is 0 nitrogen is covalently bonded to the carbon of the ring.

The carbocyclic and heterocyclic nitrogen containing compounds described above are reacted with compounds having general formula:

where R and $R_1$ are as defined above and X is a halide such as chloride, fluoride, bromide and iodide. Preferably the halide is chloride, fluoride or bromide. More preferably the halide is chloride or fluoride. The reaction takes place in the presence of tetrahydrofuran (THF) and sodium hydride under chilled conditions of 0° C. to 4° C. and stirring to provide products having the formula (I).

Exemplary aromatic nitrogen containing compounds have the following general formula:

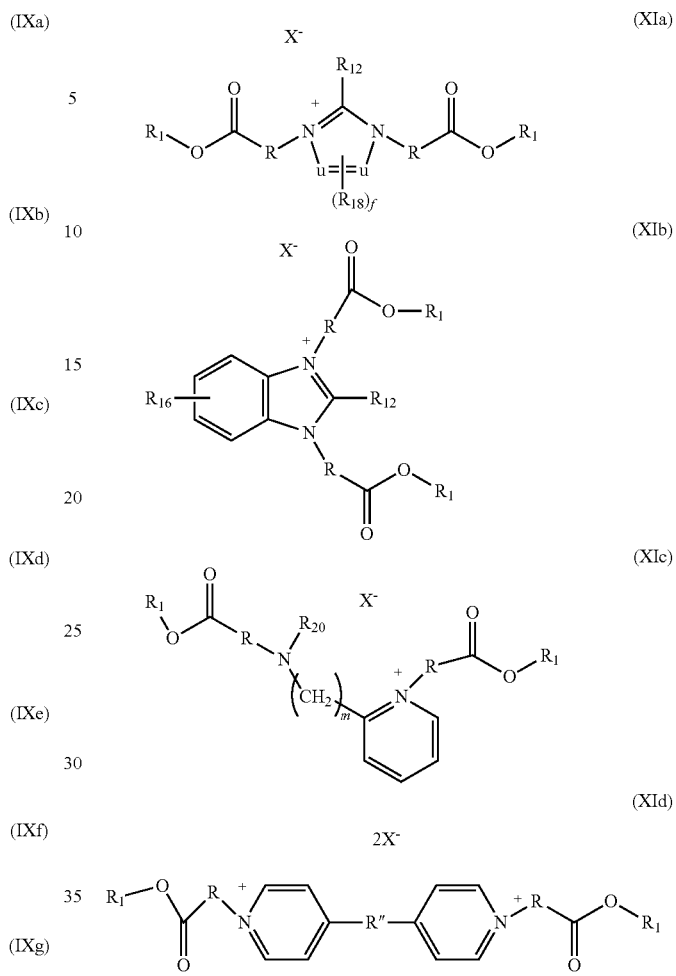

(XIa)

(XIb)

(XIc)

(XId)

wherein R, $R_1$, $R_{12}$, $R_{16}$, X, the variable m and the variable u are as defined above where preferably the variable u is carbon or nitrogen, $R_{18}$ is the same as $R_{11}$ and f is an integer 0 to 2, preferably 1 or 2, and R" is a linear or branched ($C_1$-$C_{12}$)alkyl or ($C_1$-$C_{12}$)ether.

Polyamines include, but are not limited to, compounds having general formula:

(XIIa)

where $R_{21}$ is a —$(CH_2$—$CH_2)_p$—, —$(CH_2$—$CH_2)_p$—$(NH$—$R_{24}$—$NH)_q$—$(CH_2$—$CH_2)_p$—, —$(CH_2$—$CH_2)_p$—$(O$—$R_{25}$—$O)_r$—$(CH_2)_p$—, a substituted or unsubstituted ($C_6$-$C_{18}$)aryl, where $R_{24}$ is —$(CH_2$—$CH_2)_p$—, or

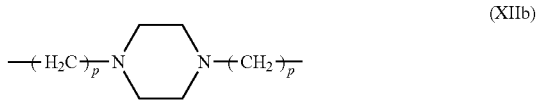

(XIIb)

where p, q and r are independently integers of one or greater, preferably from 1 to 10; $R_{22}$ and $R_{23}$ are independently hydrogen, linear or branched ($C_1$-$C_{12}$)alkyl or substituted or unsubstituted ($C_6$-$C_{18}$)aryl, where when $R_{22}$ and $R_{23}$ are ($C_1$-$C_{12}$)alkyl, they may be taken together with all of the atoms in the group to form a ring. $R_{25}$ is linear or branched ($C_2$-$C_{10}$)alkyl. Substituents on the aryl groups include, but are not limited to linear or branched ($C_1$-$C_{12}$)alkyl, linear or branched hydroxy($C_1$-$C_{12}$)alkyl, or hydroxyl.

One or more compounds of formula (I) are reacted with one or more compounds of formula (XIIa) and (XIIb) in an organic solvent and refluxing at temperatures of 45° C. to 50° C. under an inert gas atmosphere. Typically, refluxing is done under a nitrogen atmosphere. Alternatively, the compounds of formula (I) and one or more compounds of formula (XIIa) and (XIIb) may be cooked with or without solvent. The molar reaction ratio of the compounds of formula (I) to the one or more compounds of formula (XIIa) and (XIIb) may range from 1:0.1 to 1:2, preferably from 0.8:1 to 1:0.8. The compounds of formula (I) are joined to the compounds of formula (XIIa) and (XIIb) by an amide linkage. Such polymers have a general formula:

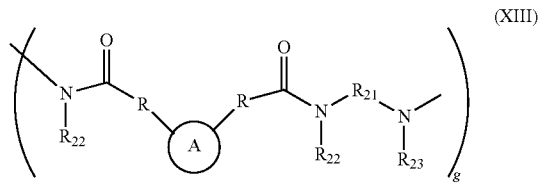

(XIII)

where R, $R_{21}$, $R_{22}$ and $R_{23}$ are as defined above and g is an integer of 2 or greater, optionally, formula (XIII) may have a positive charge. Examples of such polymers with the amide linkage are the following:

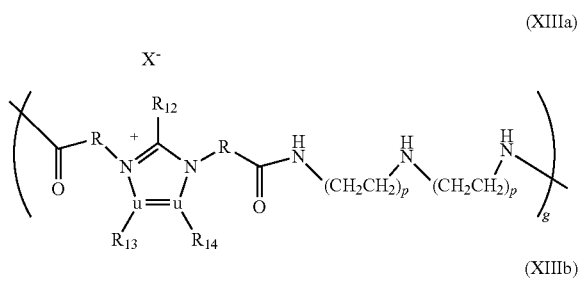

(XIIIa)

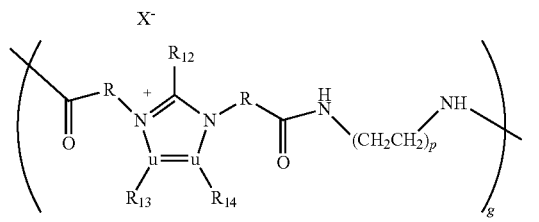

(XIIIb)

where R, $R_{12}$, $R_{13}$, $R_{14}$, $X^-$, p, u and g are defined above.

The plating composition and method are useful in providing a substantially level plated metal layer on a substrate, such as a printed circuit board. Also, the plating composition and method are useful in filling apertures in a substrate with metal. Also, the metal deposits are substantially crack-free and have good throwing power.

Any substrate upon which metal can be electroplated is useful in the present invention. Such substrates include, but are not limited to printed wiring boards, integrated circuits, semiconductor packages, lead frames and interconnects. An integrated circuit substrate may be a wafer used in a dual damascene manufacturing process. Such substrates typically contain a number of features, particularly apertures, having a variety of sizes. Through-holes in a PCB may have a variety of diameters, such as from 50 μm to 350 μm in diameter. Such through-holes may vary in depth, such as from 35 μm to 100 μm. PCBs may contain blind vias having a wide variety of sizes, such as up to 200 μm, or greater.

Conventional metal plating compositions may be used. The metal plating compositions contain a source of metal ions, an electrolyte, and a leveling agent, where the leveling agent is a reaction product of one or more nitrogen-containing compounds of formula (I) with one or more polyamine compounds. The metal plating compositions may contain a source of halide ions, an accelerator and a suppressor. Metals which may be electroplated from the compositions include, but are not limited to, copper, tin and tin/copper alloys.

Suitable copper ion sources are copper salts and include without limitation: copper sulfate; copper halides such as copper chloride; copper acetate; copper nitrate; copper fluoroborate; copper alkylsulfonates; copper arylsulfonates; copper sulfamate; and copper gluconate. Exemplary copper alkylsulfonates include copper ($C_1$-$C_6$)alkylsulfonate and more preferably copper ($C_1$-$C_3$)alkylsulfonate. Preferred copper alkylsulfonates are copper methanesulfonate, copper ethanesulfonate and copper propanesulfonate. Exemplary copper arylsulfonates include, without limitation, copper phenyl sulfonate, copper phenol sulfonate and copper p-toluene sulfonate. Mixtures of copper ion sources may be used. One or more salts of metal ions other than copper ions may be added to the present electroplating baths. Typically, the copper salt is present in an amount sufficient to provide an amount of copper metal of 10 to 180 g/L of plating solution.

Suitable tin compounds include, but are not limited to salts, such as tin halides, tin sulfates, tin alkane sulfonate such as tin methane sulfonate, tin aryl sulfonate such as tin phenyl sulfonate, tin phenol sulfonate and tin toluene sulfonate, tin alkanol sulfonate. The amount of tin compound in these electrolyte compositions is typically an amount that provides a tin content in the range of 5 to 150 g/L. Mixtures of tin compounds may be used in an amount as described above.

The electrolyte useful in the present invention may be alkaline or acidic. Typically the electrolyte is acidic. Suitable acidic electrolytes include, but are not limited to, sulfuric acid, acetic acid, fluoroboric acid, alkanesulfonic acids such as methanesulfonic acid, ethanesulfonic acid, propanesulfonic acid and trifluoromethane sulfonic acid, arylsulfonic acids such as phenyl sulfonic acid, phenol sulfonic acid and toluene sulfonic acid, sulfamic acid, hydrochloric acid, and phosphoric acid. Mixtures of acids may be advantageously used in the present metal plating baths. Preferred acids include sulfuric acid, methanesulfonic acid, ethanesulfonic acid, propanesulfonic acid, and mixtures thereof. The acids may be present in an amount in the range of from 1 to 300 g/L. Electrolytes are generally commercially available from a variety of sources and may be used without further purification.

Such electrolytes may optionally contain a source of halide ions. Typically chloride ions are used. Exemplary chloride ion sources include copper chloride, tin chloride and hydrochloric acid. A wide range of halide ion concentrations may be used in the present invention. Typically, the halide ion concentration is in the range of from 0 to 100 ppm based on the plating bath. Such halide ion sources are generally commercially available and may be used without further purification.

The plating compositions typically contain an accelerator. Any accelerators (also referred to as brightening agents) are suitable for use in the present invention. Such accelerators are well-known to those skilled in the art. Accelerators include, but are not limited to, N,N-dimethyl-dithiocarbamic acid-(3-sulfopropyl)ester; 3-mercapto-propylsulfonic acid-(3-sulfopropyl)ester; 3-mercapto-propylsulfonic acid sodium salt; carbonic acid-dithio-o-ethylester-s-ester with 3-mercapto-1-propane sulfonic acid potassium salt; bis-sulfopropyl disulfide; 3-(benzothiazolyl-s-thio)propyl sulfonic acid sodium salt; pyridinium propyl sulfobetaine; 1-sodium-3-mercaptopropane-1-sulfonate; N,N-dimethyl-dithiocarbamic acid-(3-sulfoethyl)ester; 3-mercapto-ethyl propylsulfonic acid-(3-sulfoethyl)ester; 3-mercapto-ethyl-sulfonic acid sodium salt; carbonic acid-dithio-o-ethylester-s-ester with 3-mercapto-1-ethane sulfonic acid potassium salt; bis-sulfoethyl disulfide; 3-(benzothiazolyl-s-thio)ethyl sulfonic acid sodium salt; pyridinium ethyl sulfobetaine; and 1-sodium-3-mercaptoethane-1-sulfonate. Accelerators may be used in a variety of amounts. In general, accelerators are used in an amount of 0.1 ppm to 1000 ppm.

Any compound capable of suppressing the metal plating rate may be used as a suppressor in the present electroplating compositions. Suitable suppressors include, but are not limited to, polypropylene glycol copolymers and polyethylene glycol copolymers, including ethylene oxide-propylene oxide ("EO/PO") copolymers and butyl alcohol-ethylene oxide-propylene oxide copolymers. Suitable butyl alcohol-ethylene oxide-propylene oxide copolymers are those having a weight average molecular weight of 100 to 100,000, preferably 500 to 10,000. When such suppressors are used, they are typically present in an amount in the range of from 1 to 10,000 ppm based on the weight of the composition, and more typically from 5 to 10,000 ppm.

In general, the reaction products of the compounds of formula (I) and one or more polyamine have a number average molecular weight (Mn) of 500 to 10,000, typically from 1000 to 50,000, preferably from 2000 to 8000, although reaction products having other Mn values may be used. Such reaction products may have a weight average molecular weight (Mw) value in the range of 1000 to 50,000, typically from 5000 to 30,000, although other Mw values may be used.

The amount of the reaction product (leveling agent) used in the metal electroplating compositions depend upon the particular leveling agents selected, the concentration of the metal ions in the electroplating composition, the particular electrolyte used, the concentration of the electrolyte and the current density applied. In general, the total amount of the leveling agent in the electroplating composition is from 0.01 ppm to 5,000 ppm based on the total weight of the plating composition, although greater or lesser amounts may be used. Preferably, the total amount of the leveling agent is from 0.1 to 1000 ppm, more preferably from 0.1 to 500 ppm.

The electroplating compositions may be prepared by combining the components in any order. It is preferred that the inorganic components such as source of metal ions, water, electrolyte and optional halide ion source are first added to the bath vessel followed by the organic components such as leveling agent, accelerator, suppressor, and any other organic component.

The electroplating compositions may optionally contain a second leveling agent. Such second leveling agent may be another leveling agent of the present invention, or alternatively, may be any conventional leveling agent. Suitable conventional leveling agents that can be used in combination with the present leveling agents include, without limitations, those disclosed in U.S. Pat. No. 6,610,192 to Step et al., U.S. Pat. No. 7,128,822 to Wang et al., U.S. Pat. No. 7,374,652 to Hayashi et al. and U.S. Pat. No. 6,800,188 to Hagiwara et al. Such combination of leveling agents may be used to tailor the characteristics of the plating bath, including leveling ability and throwing power.

Typically, the plating compositions may be used at any temperature from 10 to 65° C. or higher. Preferably, the temperature of the plating composition is from 10 to 35° C. and more preferably from 15 to 30° C.

In general, the metal electroplating compositions are agitated during use. Any suitable agitation method may be used and such methods are well-known in the art. Suitable agitation methods include, but are not limited to air sparging, work piece agitation, and impingement.

Typically, a substrate is electroplated by contacting the substrate with the plating composition. The substrate typically functions as the cathode. The plating composition contains an anode, which may be soluble or insoluble. Potential is typically applied to the cathode. Sufficient current density is applied and plating performed for a period of time sufficient to deposit a metal layer having a desired thickness on the substrate as well as fill blind vias and/or through-holes. Current densities, include, but are not limited to, the range of 0.05 to 10 $A/dm^2$, although higher and lower current densities may be used. The specific current density depends in part upon the substrate to be plated and the leveling agent selected. Such current density choice is within the abilities of those skilled in the art.

An advantage of the present invention is that substantially level metal deposits are obtained on a PCB. By "substantially level" metal layer is meant that the step height, i.e., the difference between areas of dense very small apertures and areas free of or substantially free of apertures, is less than 5 μm, and preferably less than 1 μm. Through-holes and/or blind vias in the PCB are substantially filled. A further advantage of the present invention is that a wide range of apertures and aperture sizes may be filled.

Throwing power is defined as the ratio of the average thickness of the metal plated in the center of a through-hole compared to the average thickness of the metal plated at the surface of the PCB sample and is reported as a percentage. The higher the throwing power, the better the plating composition is able to fill the through-hole. Metal plating compositions of the present invention have a throwing power of ≥65%, preferably ≥70%. Metal plating compositions of the present invention also show improved thermal stability of a metal plated substrate as compared to many conventional metal plating compositions.

While the methods of the present invention have been generally described with reference to printed circuit board manufacture, it is appreciated that the present invention may be useful in any electrolytic process where an essentially level or planar metal deposit and filled apertures are desired. Such processes include semiconductor packaging and interconnect manufacture.

The following examples are intended to further illustrate the invention but are not intended to limit its scope.

Example 1

6.8 g (100 mmols) of imidazole and 2.4 g (100 mmols) of sodium hydride were dissolved in 50 ml of anhydrous THF. The mixture was stirred and cooled in an ice bath for 2 hours until the formation of hydrogen gas ceased. 21.6 g (200 mmols) of ethyl chloroacetate was added and the mixture was refluxed for 12 hours. After removing the solvent by evaporation, the remaining residue was extracted by acetonitrile to obtain 1H-imidazolium 1,3-bis(2-methoxy-2-oxoethyl). The end product was confirmed by NMR spectrum. The NMR spectra were recorded at 25° C. using a Bruker 400 MHz spectrometer operating at 400.13 MHz for 1H NMR.

To a three necked flask 4 g (15.3 mmols) of 1H-imidazolium 1,3-bis(2-methoxy-2-oxoethyl), 1.7 g (15.3 mmols) of hexamethylenediamine and 20 ml of acetonitrile were added. The mixture was refluxed for 48 hours in an inert $N_2$ atmosphere. The final product (product 1) precipitated out during the reaction. The final product was confirmed by NMR spectrum which had the peaks δ ppm: 8.82-8.88 (s, 1H, $H_{aram}$); 7.65-7.52 (m, 2H, $H_{aram}$); 4.89-4.75 (m, 4H, 2× $CH_2$—N), 3.31 (broad s, 4H, 2× $CH_2$—NH); 1.60 (broad s, 4H, 2× $CH_2$—NH); and 1.40 (broad s, 4H, 2× $CH_2$—$CH_2$—$CH_2$—NH) and had the following formula:

(XIV)

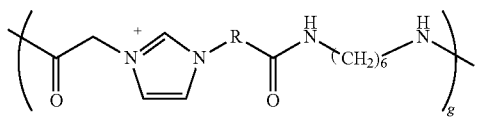

The variable g is defined above. The molecular weight of the end product was then determined by Agilent 1200 GPC unit equipped with IR detector, a PL Aquagel-OH 30 8 μm 300×7.5 mm size exclusion separation column and a PL Aquagel-OH 8 μm 50×7 5 mm guard column. The column temperature was 30° C. The mobile phase was performed in 0.1% v/v trifluoroacetic acid in DI water at a flow rate of 1 mL/min GPC calibrations were performed using polyethylene glycol standards. The Mn was determined to be 3,458 and the Mw was determined to be 7,504.

Example 2

8.2 g (100 mmols) of 4-methyl imidazole and 2.4 g (100 mmols) of sodium hydride were dissolved in 50 ml of anhydrous THF. The mixture was stirred and cooled in an ice bath for 2 hours until the formation of hydrogen gas ceased. 21.6 g (200 mmols) of ethyl chloroacetate was then added to the mixture. After refluxing for 12 hours the solvent was removed by evaporation and the remaining residue was extracted by acetonitirile to obtain 1H-imidazolium 1,3-bis (2-methoxy-2-oxoethyl). The end product was confirmed by NMR spectrum.

To a three necked flask 4.2 g (15.3 mmols) of 1H-4-methyl imidazolium 1,3-bis(2-methoxy-2-oxoethyl), 1.7 g (15.3 mmols) of hexamethylenediamine and 20 ml of acetonitrile were added. The mixture was refluxed for 48 hours under an inert $N_2$ atmosphere. The final product (product 2) precipitated out during the reaction. The product was confirmed as having the same general formula as XIII by NMR spectrum. The molecular weight of the final product was determined to be Mn=1,367 and Mw=2,708 by Agilent 1200 GPC.

Four copper electroplating solutions were prepared and each was added to separate Haring Cells. Two of the copper electroplating solutions had 2 ppm of accelerator and the other two had 3 ppm of accelerator. The formulation of the copper electroplating solutions had the formulation in Table 1 below:

TABLE 1

| COMPONENT | AMOUNT |
|---|---|
| Copper sulfate pentahydrate | 73 g/L |
| Sulfuric acid | 235 g/L |
| Chloride ion as HCL | 60 ppm |
| EO/PO copolymer with terminal hydroxyl groups and molecular weight <5000 (suppressor) | 1.5 g/L |
| Disulfide compound with sulfonic acid groups and molecular weight <1000 (accelerator) | 2 to 3 ppm |

Product 1 was added to two of the Haring Cells in amounts of 10 ppm and 20 ppm. Product 2 was added to the other two Haring Cells in amounts of 0.5 ppm and 1 ppm. A cleaned copper test panel was placed in each Haring Cell. The test panels were 3.2 mm thick double-sided FR4 PCBs 5 cm×9.5 cm with a plurality of through-holes having diameters of 300 μm. The test panels functioned as cathodes. The counter electrode was a conventional soluble copper electrode. The electrodes were connected to a rectifier and a current density of 2.2 A/$dm^2$ was applied in each Haring Cell for 80 minutes. The temperature of each solution was 25° C. during electroplating.

After copper electroplating the test panels were removed from the Haring Cells and rinsed with de-ionized water for one minute. They were then placed in a solution of ANTI-TARNISH™ 7130 solution (available from the Dow Chemical Company, Midland, Mich.) for one minute. The panels were again rinsed with de-ionized water for one minute and dried with compressed air. The copper deposit on each panel appeared bright and uniform to the naked eye.

The area of the panel with the through-holes was cut, mounted and cross-sectioned. The thickness of the copper deposit was measured on the surface of each panel as well as the average thickness in the through-holes using optical microscopy. Measured thicknesses were adjusted for through-hole location diameter after cross-sectioning. Throwing power was calculated by determining the ratio of the average thickness of the metal plated in the center of the through-hole compared to the average thickness of the metal plated at the surface of the PCB sample. The results are in Table 2 as a percentage.

The percent cracking was determined according to the industry standard procedure IPC-TM-650-2.6.8 Thermal Stress, Plated-through Holes, published by IPC (Northbrook, Ill., U.S.A., May 2004, revision E.

TABLE 2

| Reaction product | Leveler (ppm) | Accelerator (ppm) | Hole thickness (μm) | Surface thickness (μm) | TP % | % Cracking |
|---|---|---|---|---|---|---|
| 1 | 10 | 3 | 19.0 | 27.8 | 68.3 | 0 |
| 1 | 20 | 3 | 20.2 | 29.6 | 68.2 | 0 |
| 2 | 0.5 | 2 | 19.9 | 28.6 | 69.6 | 0 |
| 2 | 1 | 2 | 20.2 | 27.9 | 72.4 | 0 |

The percent cracking for each panel was determined to be 0. Accordingly, no significant cracking occurred on any of the panels.

What is claimed is:

1. A copper electroplating composition comprises: one or more sources of copper ions, an acid electrolyte, wherein the acid electrolyte comprises one or more acids and, optionally, one or more sources of halide ions, and one or more polymers, wherein the one or more polymers have the following structures:

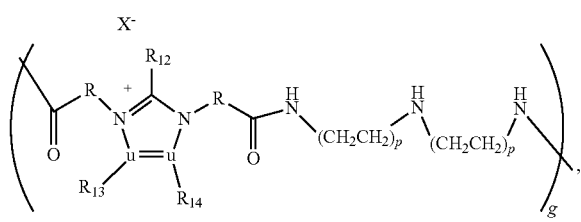

(XIIIa)

or

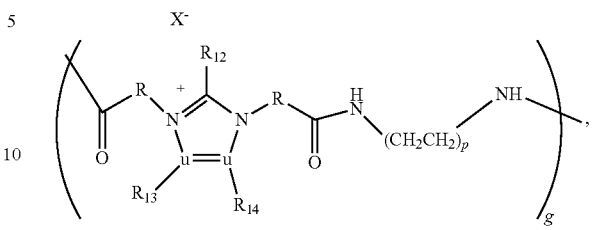

(XIIIb)

wherein R is chosen from a covalent bond, linear or branched $(C_1-C_{12})$alkyl, —NH—, —$R_2$NH— or —$R_2NHR_3$—, $R_2$ is chosen from linear or branched $(C_1-C_{12})$alkyl, $R_{12}$, $R_{13}$ and $R_{14}$ are independently chosen from hydrogen, linear or branched $(C_1-C_{12})$alkyl, substituted or unsubstituted aryl, hydroxylalkyl, hydroxyl, thio, thioalkyl, —$NH_2$, primary amine or secondary amine, u is carbon or nitrogen, p is an integer from 1-10 and g is an integer of 2 or greater, and $X^-$ is a halide.

2. The copper electroplating composition of claim 1, wherein the one or more polymers are included in the composition in amounts from 0.01 ppm to 5,000 ppm.

3. The copper electroplating composition of claim 1, further comprising one or more accelerators and suppressors.

* * * * *